United States Patent [19]

Yamazaki et al.

[11] Patent Number: 5,307,313
[45] Date of Patent: Apr. 26, 1994

[54] FLAG CIRCUIT FOR MEMORY

[75] Inventors: Akihiro Yamazaki, Sagamihara; Tomotaka Saito; Shuichi Ito, both of Yokohama, all of Japan

[73] Assignee: Kabushiki Kaisha Toshiba, Kawasaki, Japan

[21] Appl. No.: 659,506

[22] Filed: Feb. 22, 1991

[30] Foreign Application Priority Data

Feb. 23, 1990 [JP] Japan .................. 2-40914

[51] Int. Cl.⁵ .............................. G11C 8/02
[52] U.S. Cl. ................. 365/189.01; 365/201; 365/230.01
[58] Field of Search ........ 365/189.01, 230.01, 365/201

[56] References Cited

U.S. PATENT DOCUMENTS

| | | | |
|---|---|---|---|
| 4,365,312 | 12/1982 | Nakano et al. | 395/775 |
| 5,016,220 | 5/1991 | Yamagata | 365/189.01 |
| 5,023,718 | 6/1991 | Soloff | 365/189.01 |
| 5,088,063 | 2/1992 | Matsuda et al. | 365/189.01 |
| 5,151,877 | 9/1992 | Brennan | 365/189.01 |

FOREIGN PATENT DOCUMENTS 58-8588 2/1983 Japan .
61-28144 6/1986 Japan .

Primary Examiner—Margaret Rose Wambach
Attorney, Agent, or Firm—Finnegan, Henderson, Farabow, Garrett & Dunner

[57] ABSTRACT

In a semiconductor integrated circuit for switching various functions in accordance with "H"/"L" level of a read output from EPROM cells or the like, a state of memory cells incorporated in the semiconductor is detected to switch a function state. The semiconductor integrated circuit is free from an inoperative state caused by indefinite values of an initial state (erasure state) as of the EPROM cells and the like, or is free from a state in which only a predetermined operation is performed. When a writing operation is performed to EPROM cells and the like in an initial state in advance, a function test for a semiconductor integrated circuit can be normally performed. A test time can be largely decreased compared with that of a conventional technique, and a production cost can be largely reduced.

12 Claims, 4 Drawing Sheets

| S1 | S2 | S3 | S4 | S5 | S6 | PRIORITY ORDER |
|----|----|----|----|----|----|----------------|
| H  | L  | L  | L  | L  | L  | A>B>C          |
| L  | H  | L  | L  | L  | L  | A>C>B          |
| L  | L  | H  | L  | L  | L  | B>A>C          |
| L  | L  | L  | H  | L  | L  | B>C>A          |
| L  | L  | L  | L  | H  | L  | C>A>B          |
| L  | L  | L  | L  | L  | H  | C>B>A          |

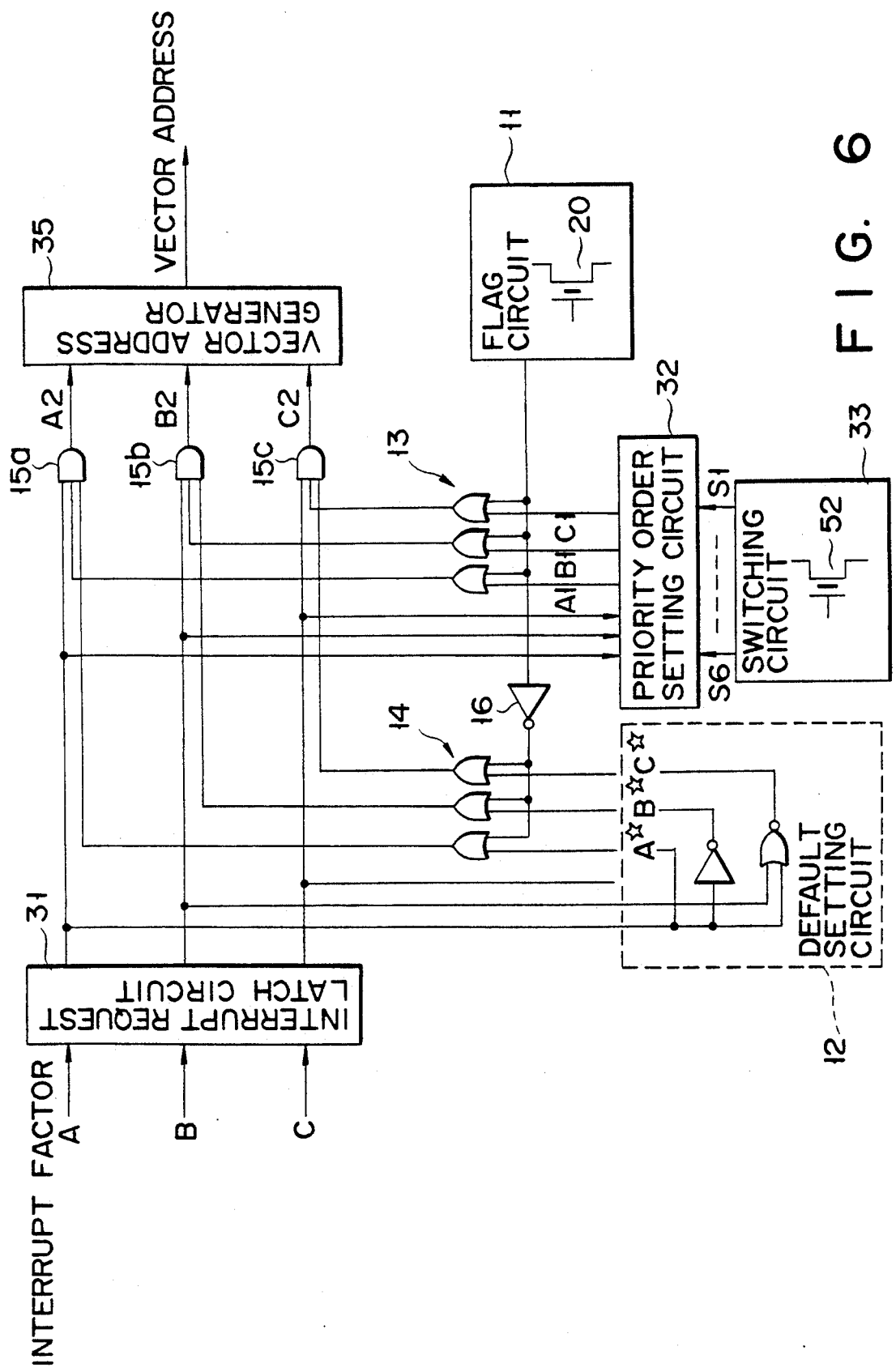

FLAG CIRCUIT FOR MEMORY

BACKGROUND OF THE INVENTION

Field of the Invention

The present invention relates to a semiconductor integrated circuit and, more particularly, to a semiconductor integrated circuit including a non-volatile memory cell used for controlling a predetermined function.

Description of the Related Art

In recent years, a one-chip microcomputer having a non-volatile memory cell such as an Electrical Programmable Read Only Memory (EPROM) has been extensively developed. This reflects several needs in the market. That is, efficiency of program development is improved by facilitation of controlling a program, and the turn around time from the release of a program to its commercialization is shortened. One-chip microcomputers are expected to be further developed.

A variety of applications corresponding to partial modifications of functions as optional selection in consideration of user convenience are available as one-chip microcomputer functions. Two applications will be described below.

FIG. 1 is a block diagram showing an optional function of a conventional one-chip microcomputer. In the circuit shown in FIG. 1, in order to store a generation time of an event by an event counter, a falling edge or a rising edge of a change in signal from a terminal is selectively used. That is, in the circuit shown in FIG. 1, a change in signal at a terminal 21 is detected to generate a latch pulse, and a content of an event counter 22 is latched by a latch circuit 23. When the change in signal from the terminal 21 is to be detected, the falling edge of the signal is detected by a falling edge detector 24, and the rising edge of the signal is detected by a rising edge detector 25. The detection outputs from the detectors 24 and 25 are selectively switched by a switching circuit 26 to generate a latch pulse. That is, a signal output from the switching circuit 26 is set to be "L" level or "H" level so as to control a detection edge of a change in signal to be selected.

FIG. 2 is a block diagram showing another optional function of a conventional one-chip microcomputer. In the circuit shown in FIG. 2, an interrupt priority order (i.e., a priority order upon simultaneous generation of a plurality of interrupts) is set. That is, in FIG. 2, reference numeral 31 denote an interrupt request latch circuit for storing requests of interrupt factors A, B, and C; and reference numeral 32 denotes a priority order setting circuit for controlling a priority order by a combination of a logic level "L"/"H" of a plurality of signals S1 to S6 output from a switching circuit 33 and by a generation state of the interrupt factors A, B, and C. Reference numerals 34a to 34c denote gate circuits to which the latch outputs A, B, and C from the request latch circuit 31 are respectively input and which consist of two-input gates ON/OFF-controlled by outputs $A_1$, $B_1$, and $C_1$ from the priority order setting circuit 32; and reference numeral 35 denotes a vector address generator for generating vector addresses corresponding to outputs $A_2$, $B_2$, and $C_2$ from the gate circuits 34a to 34c. According to the circuit in FIG. 2, one of the outputs A, B, and C from the interrupt request latch circuit 31 is selected in accordance with a priority order designated by the outputs $A_1$, $B_1$, and $C_1$ from the priority order setting circuit 32 to generate the interrupt signal $A_2$, $B_2$, or $C_2$, and a vector address corresponding to the interrupt signal can be generated.

FIG. 3 shows a truth table of the priority order setting circuit 32 in FIG. 2. In this table, a desired priority order can be obtained by a combination of states of the interrupt factors A, B, and C and one ("H" level) of six control input signals (outputs from the switching circuit 33) S1 to S6. For example, when conditions of $S1=S2=S3=S4=S5=$"L" and $S6=$"H" are satisfied and the interrupt factors A, B, and C are respectively generated, a priority order of the interrupt factors A, B, and C satisfies a condition $C>B>A$. At this time, the outputs $A_1$, $B_1$, and $C_1$ from the priority order setting circuit 32 are given by the following table.

| A | B | C | $A_1$ | $B_1$ | $C_1$ | Reception |
|---|---|---|-----|-----|-----|-----------|
| o | o | o | "L" | "L" | "H" | C |
| o | o | x | "L" | "H" | "H" | B |
| o | x | o | "L" | "L" | "H" | C |
| o | x | x | "H" | "H" | "H" | A |
| x | o | x | "L" | "H" | "H" | B |
| x | x | o | "L" | "L" | "H" | C |

In this table, a mark "o" denotes generation of an interrupt factor, and a mark "x" denotes non-generation of an interrupt factor.

That is, the interrupt factor A is received only when the interrupt factors B and C are not requested. In other words, at only this time, the output $A_1$ from the priority order setting circuit goes to "H" level. In addition, the interrupt factor B is received only when the interrupt factor C is not requested. In other words, at only this time, the output $B_1$ from the priority order setting circuit goes to "H" level. Whenever the interrupt factor C is requested, the output $C_1$ from the priority order setting circuit goes to "H" level.

A method of setting the outputs $A_1$, $B_1$, and $C_1$ from the priority order setting circuit 32 to be "H"/"L" level is performed by controlling wires of the switching circuit 33 or by ON/OFF-operating a program element. Especially in a microcomputer having an EPROM, in order to reduce the turn around time, as in a ROM section, an EPROM cell is generally used as a program element in the switching circuit 33.

FIG. 4 shows an example of the switching circuit 33 in FIG. 2 wherein one bit (one of switches $S_1, S_2, \ldots S_6$) obtained by an ON(non-writing state)/OFF(written state) operation of an EPROM cell is extracted. Referring to FIG. 4, reference numeral 51 denotes a write data buffer; 52, an EPROM cell; 53, a write circuit connected between a write high voltage Vpp and the drain of the EPROM cell 52; 54, a gate potential control buffer for controlling the control gate potential of the EPROM cell 52; 55 a power source switching circuit for switching and supplying a write high voltage Vpp and a read power source voltage Vcc to the write data buffer 51 and the gate potential control buffer 54 in correspondence with a write mode and a read mode, respectively; and 56, a read circuit connected to the drain of the EPROM cell 52. An output Si (i=1 to 6) is supplied to the priority order setting circuit 32 as a priority order control signal.

Since the operation of the switching circuit 33 shown in FIG. 4 is known well, a description thereof will be omitted.

In the EPROM cell 52, electrons may be injected in a floating gate due to various reasons in the manufacturing process. Upon completion of a step in a wafer, after a microcomputer having an EPROM is erased once by an ultraviolet beam, a function test such as die sorting is generally performed. At this time, all data of the EPROM cell 52 are set to be an ON state (erasure state), and the output signal from the EPROM cell 52 is set to be at the "H" level.

When the function test is performed on the microcomputer having the above wafer, as in the circuit shown in FIG. 1, one signal output from the switching circuit 26 upon controlling optional functions is simply controlled to be "L"/"H" level. In this case, since one optional function is automatically selected, no problem arises.

However, as in the circuit shown in FIG. 2, when a combination of logic levels "L"/"H" of a plurality of signals output from the switching circuit 33 is required to be controlled, and when all the control input signals S1 to S6 used as a truth value of the priority order setting circuit 32 are inhibited to be an "H" level state (i.e., a state is not given by the truth table in FIG. 3), the priority order setting circuit 32 is set in an inhibition state in an initial state. As described above, when the inhibition state of the circuit having an inhibition combination of the control input signals corresponds to an initial state of a non-volatile memory, a function test for a microcomputer cannot be normally performed. More specifically, when an optional function control circuit in which a non-volatile memory cell such as an EPROM cell used for controlling optional functions is set in an ultraviolet erasing state so as to be inhibited is used, a function test for the microcomputer cannot be performed in an initial state of the EPROM cell for controlling the optional functions, and a burn-in test cannot be normally performed, thereby degrading the reliability of the products.

The above problem can be solved as will be described below. That is, the EPROM cell 52 in an erasing state is written in advance, and ROM data and an optional function are set. Thereafter, the function test is performed. This method is not preferable, since a test time is greatly increased during mass production. A time required for writing and testing operations for the EPROM cell 52 is several times the time required for a function test of a microcomputer. That is, after the EPROM cell 52 is written and tested while a long time is wasted, the function test of the microcomputer is performed to detect a fault thereof. Therefore, the writing and testing operations for the EPROM cell 52 which are performed in advance are wasted.

In contrast to this, when the function test for the microcomputers is performed for a short time in advance, the writing and testing operations for the EPROM cells 52 which were detected to be normal can be effectively performed only in microcomputers. In this case, the time required for the testing operation can be decreased as a whole. In recent years, reduction in production cost has been strongly demanded to increase competitiveness. Therefore, a test time serving as an important factor for the production cost cannot be easily increased in practice.

In a microcomputer using a one-time PROM cell, after the microcomputer is packaged as a semiconductor integrated circuit, a writing operation for the EPROM cell cannot be performed. For this reason, as described above, when an optional function control circuit which is set in an inhibition state by data from the EPROM cell set in an initial state (erasing state) is used, a function test for a microcomputer can be performed. In addition, when a burn-in test is performed after packaging a microcomputer, since the microcomputer is normally operated, the burn-in test cannot be performed. Therefore, reliability of products is degraded.

SUMMARY OF THE INVENTION

The present invention has been made to solve the above problem, and has as its object to provide a semiconductor integrated circuit in which, even when a non-volatile memory cell incorporated in the semiconductor device and used for controlling a predetermined function is set in an initial state, a function test for the semiconductor integrated circuit can be normally performed, and a burn-in test can be normally performed, thereby increasing reliability of products.

According to one aspect of the present invention, the semiconductor integrated circuit having non-volatile memory cells for controlling a predetermined function comprises a function switching circuit for switching said predetermined function between first and second states on the basis of data obtained by a combination of outputs from said non-volatile memory cells.

According to another aspect of the present invention, the semiconductor integrated circuit having non-volatile memory cells for controlling a predetermined function comprises a flag circuit, consisting of a non-volatile memory cell identical to the above non-volatile memory cells, for outputting data indicating a state of the non-volatile memory cells for controlling the predetermined function, and a function switching circuit for switching the predetermined function between first and second states on the basis of data from the flag circuit.

When, in one aspect of the present invention, it is detected that the non-volatile memory cells for controlling a predetermined function are set in a predetermined state on the basis of the data from the outputs of the non-volatile memory cells of the switching circuit, the predetermined function of the semiconductor integrated circuit is forcibly set in another state except for the predetermined state by an AND circuit.

When, in another aspect of the present invention, it is detected that the non-volatile memory cells for controlling a predetermined function is set in an initial state on the basis of the data from the non-volatile memory cell of the flag circuit, the predetermined function of the semiconductor integrated circuit is forcibly set in a predetermined default state by an initial state setting circuit.

Therefore, in a semiconductor integrated circuit in which a predetermined function is controlled to be set in an inhibition state by a combination of predetermined function control signals having a plurality of bits and output when the non-volatile memory cells for controlling the predetermined function is set in an initial state, the predetermined function can be avoided from being set in an inhibition state by an initial state setting circuit when the non-volatile memory cells for controlling the predetermined function are set in an initial state.

In addition, in a semiconductor integrated circuit in which a predetermined function is controlled to be set in a first function state by a combination of predetermined function control signals having a plurality of bits and output when the non-volatile memory cells for controlling the predetermined function are set in an initial state, the predetermined function is set in a second function state except for the first function state by the initial state setting circuit when the non-volatile memory cells for controlling the predetermined function are set in an initial state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a block diagram showing an arrangement of a semiconductor integrated circuit according to another embodiment of the present invention.

DETAILED DESCRIPTION OF THE PREFERRED EMBODIMENTS

Embodiments of the semiconductor integrated circuit according to the present invention will be described below with reference to the accompanying drawings.

Figure 1:
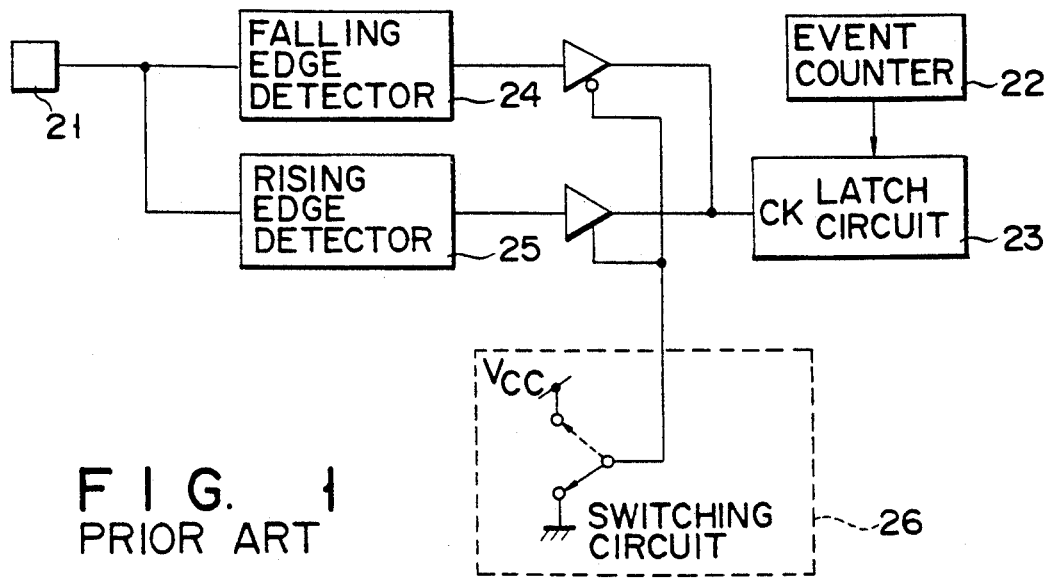
FIG. 1 is a block diagram showing an optional function of a conventional one-chip microcomputer.
Figure 2:
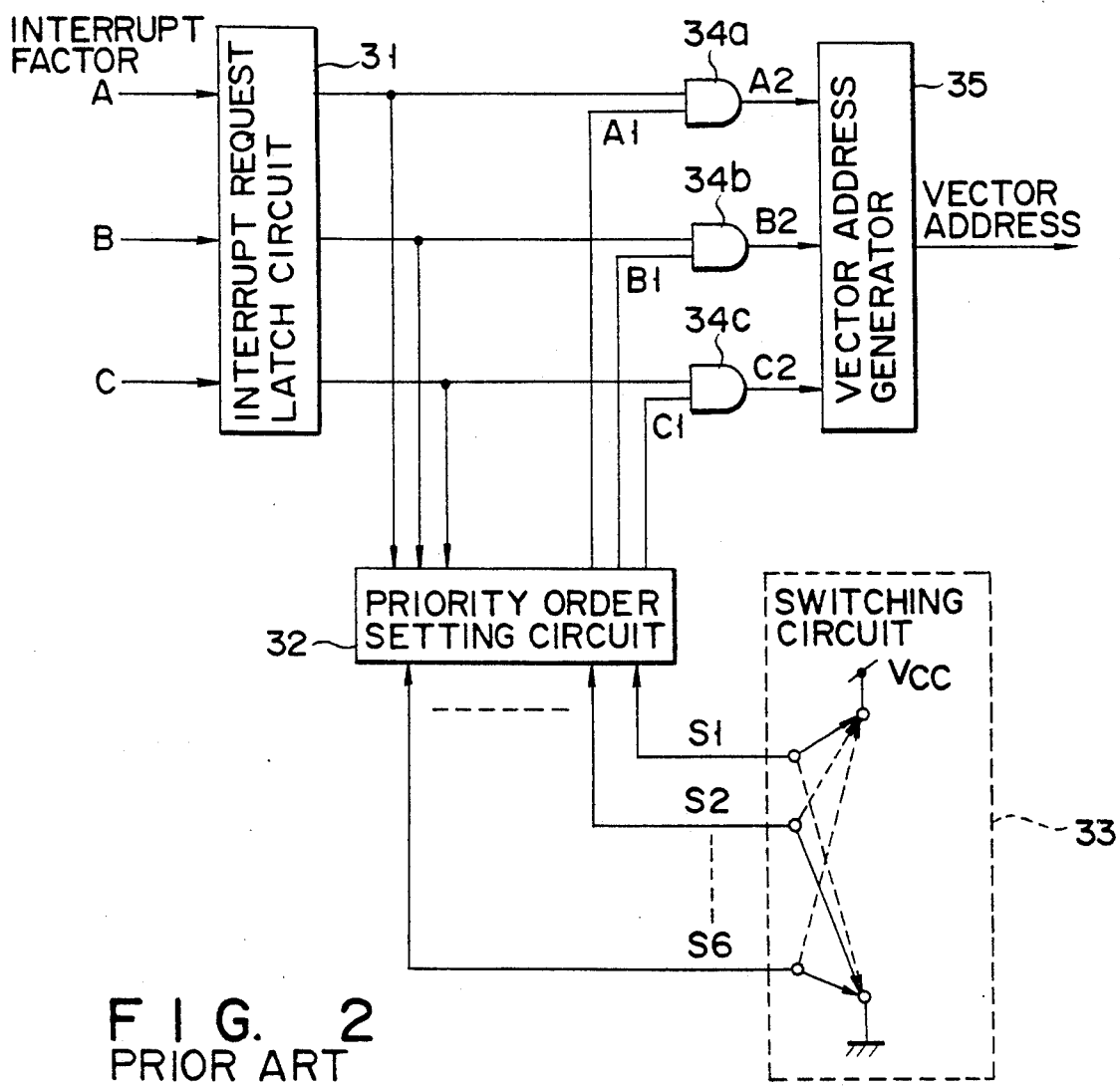
FIG. 2 is a block diagram showing another optional function of the conventional one-chip microcomputer.
Figures 3, 4:
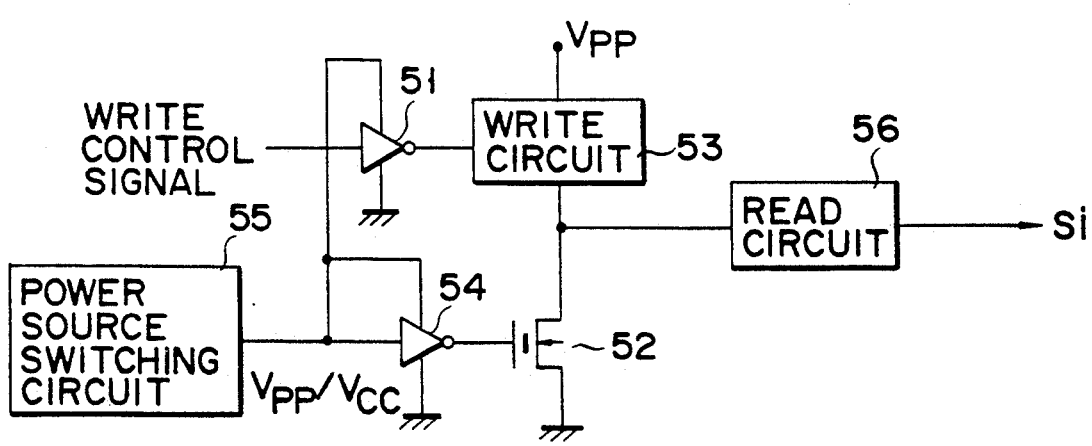
FIG. 3 is a truth table of an operation of the priority order setting circuit 32 in FIG. 2.
FIG. 4 is a block diagram showing a one-bit arrangement of the switching circuit 33 in FIG. 2.
Figure 5:
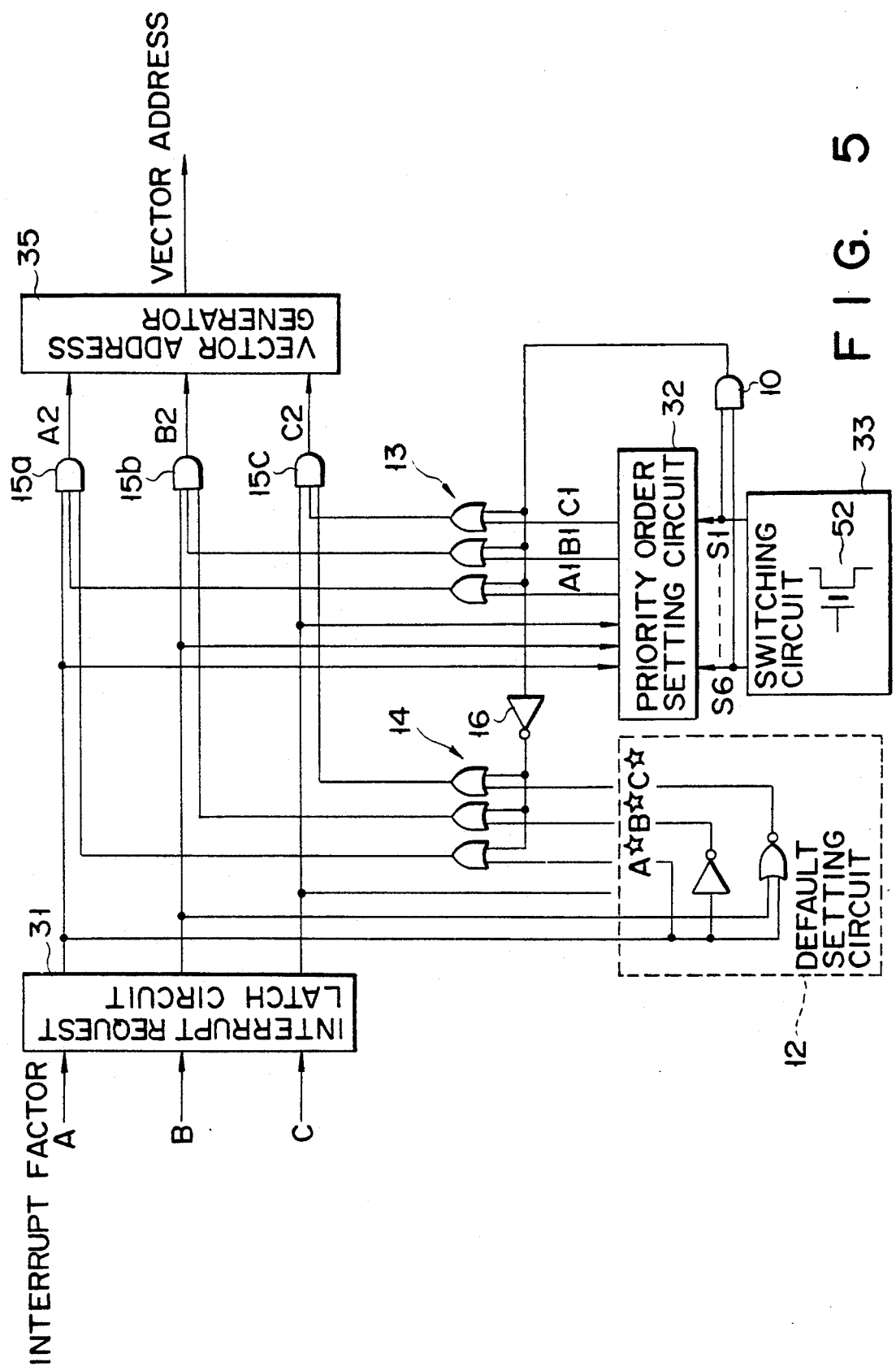
FIG. 5 is a block diagram showing an arrangement of a semiconductor integrated circuit according to an embodiment of the present invention.

FIG. 5 is a block diagram showing an arrangement of a semiconductor integrated circuit according to an embodiment of the present invention, and shows a circuit for setting an interrupt priority order in a one-chip microcomputer. In this embodiment, the following points are different from the conventional circuit shown in FIG. 2. That is, (1) an AND circuit 10, input terminals of which are connected to the outputs of the switching circuit 33, is provided; (2) a default setting circuit 12 for generating a control output for setting an interrupt priority order setting function of the microcomputer is provided; (3) switching selectors 13 and 14 for selectively setting outputs $A_1$, $B_1$, and $C_1$ from a priority order setting circuit 32 or outputs $A^*$, $B^*$, and $C^*$ from the default setting circuit 12 in accordance with data from the AND circuit 10 are provided; (4) gate circuits 15a to 15c are three-input gates and select outputs A, B, and C from an interrupt request latch circuit 31 in accordance with outputs from the switching selectors 13 and 14. Since other aspects are the same as the conventional ones, the same reference numerals as in FIG. 2 denote the same parts in FIG. 5. A function switching circuit comprises the AND circuit 10, the default setting circuit 12 and the switching selectors 13 and 14 in the embodiment shown in FIG. 5.

According to the above one-chip microcomputer in FIG. 5, a logical sum of output data from the AND circuit 10 and the outputs $A_1$, $B_1$, and $C_1$ from the priority order setting circuit 32 is calculated by the switching selector 13, and a logical sum of data obtained by inverting the output data from the AND circuit 10 by an inverter 16 and the outputs $A^*$, $B^*$, and $C^*$ from the default setting circuit 12 is calculated by the switching selector 14. Output data from the AND circuit 10 is set to be at the "H" level when the switching circuit 33 outputs the signals S1 to S6 all at the "H" level. When the EPROM cell 52 of the switching circuit 33 for setting a priority order is set in an initial state, the output data from the AND circuit 10 is set to be at the "H" level. Therefore, an output from the switching selector 13 is set to be at the "H" level regardless of the outputs $A_1$, $B_1$, and $C_1$ from the priority order setting circuit 32. The outputs $A^*$, $B^*$, and $C^*$ from the default setting circuit 12 are generated from the output terminal of the switching selector 14.

According to the one-chip microcomputer of the above embodiment, when the EPROM cell 52 of the switching circuit 33, used for controlling an optional function, is set in an initial state, a specific one of the interrupt factors A, B, and C is determined to be received by an output from the default setting circuit 12. For this reason, a function test for a microcomputer can be normally performed, and a burn-in test can be normally performed after packaging the microcomputer, thereby increasing reliability of the products.

FIG. 6 is a block diagram showing an arrangement of a semiconductor integrated circuit according to another embodiment of the present invention. In the circuit shown in FIG. 6, a flag circuit 11 using a non-volatile memory cell (e.g., an EPROM cell) 20, used for a flag and identical to a non-volatile memory cell 52 of the switching circuit 33 for setting a priority to order, is provided instead of the AND circuit 10 of FIG. 5. A function switching circuit comprises the default setting circuit 12 and the switching selectors 13 and 14 in the embodiment shown in FIG. 6.

According to the above one-chip microcomputer of FIG. 6, a logical sum of output data from the flag circuit 11 and the outputs $A_1$, $B_1$, and $C_1$ from the priority order setting circuit 32 is also calculated by the switching selector 13, and a logical sum of data obtained by inverting the output data from the flag circuit 11 by an inverter 16 and the outputs $A^*$, $B^*$, and $C^*$ from the default setting circuit 12 is also calculated by the switching selector 14. Output data from the flag circuit 11 is set to be at the "H" level when the EPROM cell 20 of the flag circuit 11 is set in an initial state (erasing state by an ultraviolet beam). When the EPROM cell 52 of the switching circuit 33 is set in an initial state, since the non-volatile memory cell 52 consists of the same memory cell as the non-volatile memory cell 20, the output data from the flag circuit 11 is set to be at the "H" level. As a result, an output from the switching selector 13 is set to be at the "H" level regardless of the outputs $A_1$, $B_1$, and $C_1$ from the priority order setting circuit 32, and the outputs $A^*$, $B^*$, and $C^*$ from the default setting circuit 12 are generated from the output terminal of the switching selector 14.

When a writing operation is performed to an EPROM cell of the switching circuit 33 set in an erasing state (initial state), a writing operation is performed to the EPROM cell 20 of the flag circuit 11. In this case, output data from the flag circuit 11 is set to be at the "L" level, an output from the default setting circuit 12 is inhibited by the switching selector 14, and the priority order setting circuit 32 can set the priority order arbitrarily through the switching selector 13.

Although the default setting circuit 12 in FIGS. 5 and 6 generates a control output for setting an interrupt priority order to satisfy a condition of A>B>C, a priority order is not limited to this priority order. Additional, although the flag circuit 11 in FIG. 6 consists of a one-bit EPROM cell, it may consist of a multi-bit EPROM cell.

According to the present invention, in a semiconductor integrated circuit for switching various functions in accordance with the "H"/"L" level of an output read from an EPROM cell, since the EPROM cell is set in an initial state (e.g., erasing state) not to determine its value, the semiconductor integrated circuit is free from an inoperative state caused by indefinite values of an initial state (e.g., erasure state) of the EPROM cell and the like, and is free from a state in which only a predetermined operation is performed. Therefore, even when a writing operation is not performed to an EPROM cell set in an initial state in advance, a function test for the semiconductor integrated circuit can be performed. The test time can be greatly decreased compared with a conventional technique, and the production cost can be greatly reduced. In addition, only a small number of logic circuits are required for the embodiment of the present invention, and only a one-bit memory cell is generally added to the non-volatile memory cell used for the flag. Therefore, a chip size is not increased as a whole. On the user side, even when a writing operation is not performed to an EPROM cell, or the like, in an initial state in advance, a test for receiving products can be advantageously performed.

Although the EPROM cell 52 is described in the above embodiments as a non-volatile memory cell for setting an interrupt order, when a flash (batch erasing) EPROM cell or an EEPROM cell is used, the present invention can be performed in accordance with the above embodiments.

Although an interrupt priority order is set as the control of the optional function in the above embodiments, the present invention can be applied to a one-chip microcomputer having a non-volatile memory cell used for controlling a predetermined function. That is, in a one-chip microcomputer in which a predetermined function is controlled to be set in an inhibition state by a combination of predetermined function control signals having a plurality of bits output when a non-volatile memory cell for controlling a predetermined function is set in an initial state, the predetermined function is avoided from being set in the inhibition state by a default control output when the non-volatile memory cell for controlling the predetermined function is set in the initial state.

In a one-chip microcomputer in which a predetermined function is controlled to be fixedly set in a first function state by a combination of predetermined function control signals (e.g., all signals are set to be at the "H" level) having a plurality of bits output from a non-volatile memory cell for controlling a predetermined function, a predetermined function controlled by the non-volatile memory cell for controlling the predetermined function can be set in a second function state except for the first function state by a default control output.

Although a one-chip microcomputer is described in the above embodiments, the present invention is not limited to those embodiments. The present invention may be applied to a microprocessor having a non-volatile memory cell for controlling a predetermined function and other semiconductor integrated circuits.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit having non-volatile memory cells for controlling predetermined function, the semiconductor integrated circuit comprising:
    a flag circuit, comprising a non-volatile memory cell substantially identical to said non-volatile memory cells, for outputting data indicating a state of said non-volatile memory cells for controlling said predetermined function; and
    a function switching circuit for switching said predetermined function between first and second states on the basis of the data output from the flag circuit.

2. The circuit according to claim 1, wherein, when it is detected that said non-volatile memory cells for controlling said predetermined function are set in an initial state on the basis of data output from said flag circuit, said predetermined function of said semiconductor integrated circuit is forcibly set in a predetermined default state.

3. The circuit according to claim 1, wherein said predetermined function is set in an undefined state by a combination of function control signals when said non-volatile memory cells for controlling said predetermined function are set in an initial state and said function switching circuit switches a state of said predetermined function such that said predetermined function is avoided from being set in said undefined state by the combination of function control signals.

4. The circuit according to claim 1, wherein said function switching circuit includes a default setting circuit for outputting a predetermined default state and switching selectors for switching a connection between said non-volatile memory cells for controlling said predetermined function and said default setting circuit to a connection between said non-volatile memory cells for controlling said predetermined function and a to-be-tested circuit on the basis of the output data from said flag circuit.

5. The circuit according to claim 1, wherein said flag circuit comprises a one-bit non-volatile memory cell.

6. The circuit according to claim 1, wherein said semiconductor integrated circuit is a one-chip microcomputer.

7. The circuit according to claim 1, wherein said non-volatile memory cells comprise any one selected from an EPROM cell, a flash EEPROM cell, and an EEPROM cell.

8. A semiconductor integrated circuit having non-volatile memory cells for controlling a predetermined function, comprising:
    a circuit including a plurality of input terminals for detecting whether the non-volatile memory cells are in an initial state and whether the input terminals are connected to a plurality of output terminals of a switching circuit for controlling optional functions of a to-be-tested circuit; and a function switching circuit for switching the predetermined function between first and second states on the basis of data output from the detecting circuit, wherein the non-volatile memory cells are selected from an EPROM cell, a flash EPROM cell, and an EEPROM cell.

9. The circuit according to claim 8, wherein, when it is detected that the non-volatile memory cells for controlling the predetermined function are set in an initial state on the basis of data output from the detecting circuit, the predetermined function of the semiconductor integrated circuit is forcibly set in a predetermined default state.

10. The circuit according to claim 8, wherein the predetermined function is set in an undefined state by a combination of function control signals when the non-volatile memory cells for controlling the predetermined function are set in an initial state and the function switching circuit switches a state of the predetermined function such that the predetermined function is avoided from being set in the undefined state by the combination of function control signals.

11. The circuit according to claim 8, wherein the function switching circuit includes a default setting circuit for outputting a predetermined default state and switching selectors for switching a connection between the non-volatile memory cells for controlling the predetermined function and the default setting circuit to a connection between the non-volatile memory cells for controlling the predetermined function and a to-be-tested circuit on the basis of the data output from the detecting circuit.

12. The circuit according to claim 8, wherein the semiconductor integrated circuit is a one-chip microcomputer.

* * * * *

UNITED STATES PATENT AND TRADEMARK OFFICE
CERTIFICATE OF CORRECTION

PATENT NO. : 5,307,313
DATED : April 26, 1994
INVENTOR(S) : Akihiro Yamazaki et al.

It is certified that error appears in the above-indentified patent and that said Letters Patent is hereby corrected as shown below:

Claim 1, column 8, line 13, after "controlling" insert --a--.

Signed and Sealed this

Twenty-seventh Day of December, 1994

Attest:

BRUCE LEHMAN

*Attesting Officer*   *Commissioner of Patents and Trademarks*